US009892888B2

(12) United States Patent
Baek et al.

(10) Patent No.: US 9,892,888 B2
(45) Date of Patent: *Feb. 13, 2018

(54) PARTICLE GENERATION SUPPRESOR BY DC BIAS MODULATION

(71) Applicant: Applied Materials, Inc., Santa Clara, CA (US)

(72) Inventors: Jonghoon Baek, San Jose, CA (US);
Soonam Park, Sunnyvale, CA (US);
Xinglong Chen, San Jose, CA (US);
Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/587,129

(22) Filed: May 4, 2017

(65) Prior Publication Data

US 2017/0236689 A1 Aug. 17, 2017

Related U.S. Application Data

(60) Continuation of application No. 15/424,355, filed on Feb. 3, 2017, which is a division of application No. 14/514,930, filed on Oct. 15, 2014, now Pat. No. 9,593,421.

(60) Provisional application No. 61/900,838, filed on Nov. 6, 2013.

(51) Int. Cl.
*C23C 16/50* (2006.01)
*H05H 1/24* (2006.01)
*H01J 37/32* (2006.01)

(52) U.S. Cl.
CPC .... *H01J 37/32082* (2013.01); *H01J 37/3255* (2013.01); *H01J 37/32568* (2013.01); *H01J 2237/334* (2013.01)

(58) Field of Classification Search
CPC ....... C23C 16/50; C23C 16/52; C23C 16/503; C23C 16/4401; C23C 16/4404; H05H 1/24
See application file for complete search history.

(56) References Cited

U.S. PATENT DOCUMENTS

| | | | |
|---|---|---|---|
| 3,753,092 A | 8/1973 | Ludlow et al. | |
| 4,816,126 A * | 3/1989 | Kamoshida | H01L 21/2636 204/192.15 |
| 5,980,999 A * | 11/1999 | Goto | H01L 21/20 427/570 |
| 6,287,943 B1 * | 9/2001 | Fujioka | C23C 16/509 136/245 |
| 6,290,806 B1 * | 9/2001 | Donohoe | H01J 37/32082 118/723 ER |
| 6,356,097 B1 * | 3/2002 | Loewenhardt | B24B 37/013 257/E21.528 |
| 6,430,403 B1 * | 8/2002 | Kossor | H03G 3/3042 330/289 |
| 7,193,173 B2 | 3/2007 | Wiepking et al. | |
| 8,545,671 B2 | 10/2013 | Honda | |
| 2002/0033744 A1 | 3/2002 | Sengupta et al. | |
| 2002/0088542 A1 | 7/2002 | Nishikawa et al. | |
| 2007/0181057 A1 | 8/2007 | Lam et al. | |
| 2009/0056877 A1 | 3/2009 | Matsuura et al. | |
| 2010/0089319 A1 | 4/2010 | Sorensen et al. | |
| 2010/0140221 A1 | 6/2010 | Kikuchi | |
| 2010/0224325 A1 * | 9/2010 | Himori | H01J 37/3255 156/345.44 |
| 2011/0114601 A1 | 5/2011 | Lubomirsky et al. | |
| 2011/0309049 A1 | 12/2011 | Papasouliotis et al. | |
| 2013/0008778 A1 | 1/2013 | Hoffman et al. | |
| 2013/0168643 A1 | 7/2013 | Lin et al. | |
| 2013/0260567 A1 | 10/2013 | Marakhtanov et al. | |

FOREIGN PATENT DOCUMENTS

JP 2008244103 A 10/2008
KR 1020080096771 A 11/2008

OTHER PUBLICATIONS

Panagopoulos, Theodoros, et al., "Plasma sheath model and ion energy distribution for all radio frequencies". Journal of Applied Physics, vol. 85, No. 7, Apr. 1, 1999, pp. 3435-3443.*
Schwarz, J., "Noninvasive Plasma Diagnostics in a Parallel-Plate Reactor for RF Discharges". Plasma Chemistry and Plasma Processing, vol. 16, No. 4, 1996, pp. 487-498.*
Kawamura, E., et al., "Ion energy distributions in rf sheaths; review, analysis and simulation." Plasma Sources Sci. Technol. 8 (1999) R45-R64.*
Chandhok, Manish, et al., "Modeling the Pressure Dependence of DC Bias Voltage in Asymmetric, Capacitive RF Sheaths". IEEE Transactions on Plasma Science, vol. 26, No. 2, Apr. 1998, pp. 181-189.

(Continued)

*Primary Examiner* — Bret P Chen
(74) *Attorney, Agent, or Firm* — Patterson + Sheridan, LLP

(57) ABSTRACT

Methods for reducing particle generation in a processing chamber are disclosed. The methods generally include generating a plasma between a first electrode and a second electrode of the processing chamber by applying a radio frequency (RF) power to the first electrode during an etch process, wherein the first electrode is disposed above the second electrode, and the second electrode is disposed above and opposing a substrate support having a substrate supporting surface, and applying a constant zero DC bias voltage to the first electrode during the process.

12 Claims, 5 Drawing Sheets

(56) References Cited

OTHER PUBLICATIONS

Lu, Yu, et al., "Bias voltage and temperature dependence of magnetotunneling effect". Journal of Applied Physics, vol. 83, No. 11, Jun. 1, 1998, pp. 6515-6517.
Panagopoulos, Theodoros, et al., "Plasma sheath model and ion energy distribution for all radio frequencies". Journal of Applied Physics, vol. 85, No. 7, Apr. 1, 1999, pp. 3435-3440.
International Search Report and Written Opinion for International Application No. PCT/US2014/060768 dated Jan. 15, 2015.
Office Action for U.S. Appl. No. 14/514,930 dated Jun. 22, 2016.
Office Action for U.S. Appl. No. 14/514,930 dated Sep. 29, 2016.
Notice of Allowance for U.S. Appl. No. 14/514,930 dated Dec. 16, 2016.

* cited by examiner

Scheme (6): No DC Bias
Adder: 4081

Scheme (7): 0 DC Bias
Adder: 752

Scheme (8): +75 DC Bias
Adder: 9075

Scheme (9): +100 DC Bias
Adder: 3458

PARTICLE GENERATION SUPPRESOR BY DC BIAS MODULATION

CROSS-REFERENCE TO RELATED APPLICATIONS

This application is a continuation of U.S. patent application Ser. No. 15/424,355 filed Feb. 3, 2017, which is a divisional of U.S. patent application Ser. No. 14/514,930 filed Oct. 15, 2014, now granted Mar. 14, 2017 as U.S. Pat. No. 9,593,421, which claims benefit of U.S. Provisional Patent Application No. 61/900,838, filed Nov. 6, 2013, all of which are herein incorporated by reference in their entireties.

BACKGROUND

Field

Embodiments of the present disclosure generally relate to an apparatus and method for reducing particle generation in a processing chamber.

Description of the Related Art

In the fabrication of semiconductor devices, plasma chambers commonly are used to perform various fabrication processes such as etching, chemical vapor deposition (CVD), and sputtering. Generally, a vacuum pump maintains a very low pressure within the chamber while a mixture of process gases continuously flows into the chamber and an electrical power source excites the gases into a plasma state. The constituents of the process gas mixture are chosen to effect the desired fabrication process It has been observed that one of conventional plasma processing chamber designs in which the plasma is generated between two parallel electrodes positioned over a gas distribution plate can cause unwanted particle contamination on a substrate surface due to ion bombardment of the electrodes. In deposition or etch processes that require a higher RF input power (e.g., over 550 W), once the plasma has been created, a high self-induced negative DC bias is also naturally established at the powered electrode. The electrical potential difference between the plasma and the self-induced negative DC bias forms a sheath voltage at or near the powered electrode. This sheath voltage causes positive ions within the plasma to accelerate toward the powered electrode, resulting in ion bombardment of the powered electrode. In instances where the powered electrode includes a protective coating layer, a portion of the protective coating layer may flake off as a result of the ion bombardment and contaminate the substrate surface. While a lower input power can be used to generate the plasma (and thus reduce particle contamination), the film deposition/removal rate will be decreased, which in turn lowers the process yield.

Therefore, there is a need in the art for an apparatus and process that effectively reduces the generation of contaminating particles on the substrate surface and maintains high process yield even with a high plasma power, without significantly increasing the processing or hardware cost.

SUMMARY

Embodiments of the present disclosure generally relate to a method for reducing particle generation in a processing chamber. In one embodiment, the method includes generating a plasma between a first electrode and a second electrode of the processing chamber by applying a radio frequency (RF) power to the first electrode during an etch process, wherein the first electrode is disposed above the second electrode, and the second electrode is disposed above and opposing a substrate support having a substrate supporting surface, and applying a constant zero DC bias voltage to the first electrode during the process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to an apparatus and method for reducing particle generation in a processing chamber. The method generally includes generating a plasma between a top electrode and a bottom electrode, and applying a zero DC bias voltage to the top electrode so that the top electrode is operated with a constant zero DC bias voltage during an etch process. In another embodiment, an apparatus for processing a substrate is provided. The apparatus generally includes a lid assembly disposed above a chamber body. The lid assembly has a top powered electrode and a grounded bottom electrode disposed parallel to the top powered electrode, defining a plasma volume therebetween. A low-pass filter is disposed between the lid assembly and a RF power supply and configured to direct DC bias to ground so that the top electrode (RF hot) is operated at a constant zero DC bias voltage during an etch process.

Applying zero DC bias voltage to the top electrode minimizes the electrical potential difference between the top powered electrode and the plasma or the electrical potential difference between the grounded bottom electrode and the plasma that would otherwise cause particle contaminations on the substrate surface due to ion bombardment of the protective coating layer on the top powered electrode or the grounded bottom electrode. Details of the disclosure and various implementations are discussed below.

Exemplary Chamber Hardware

Figure 1:
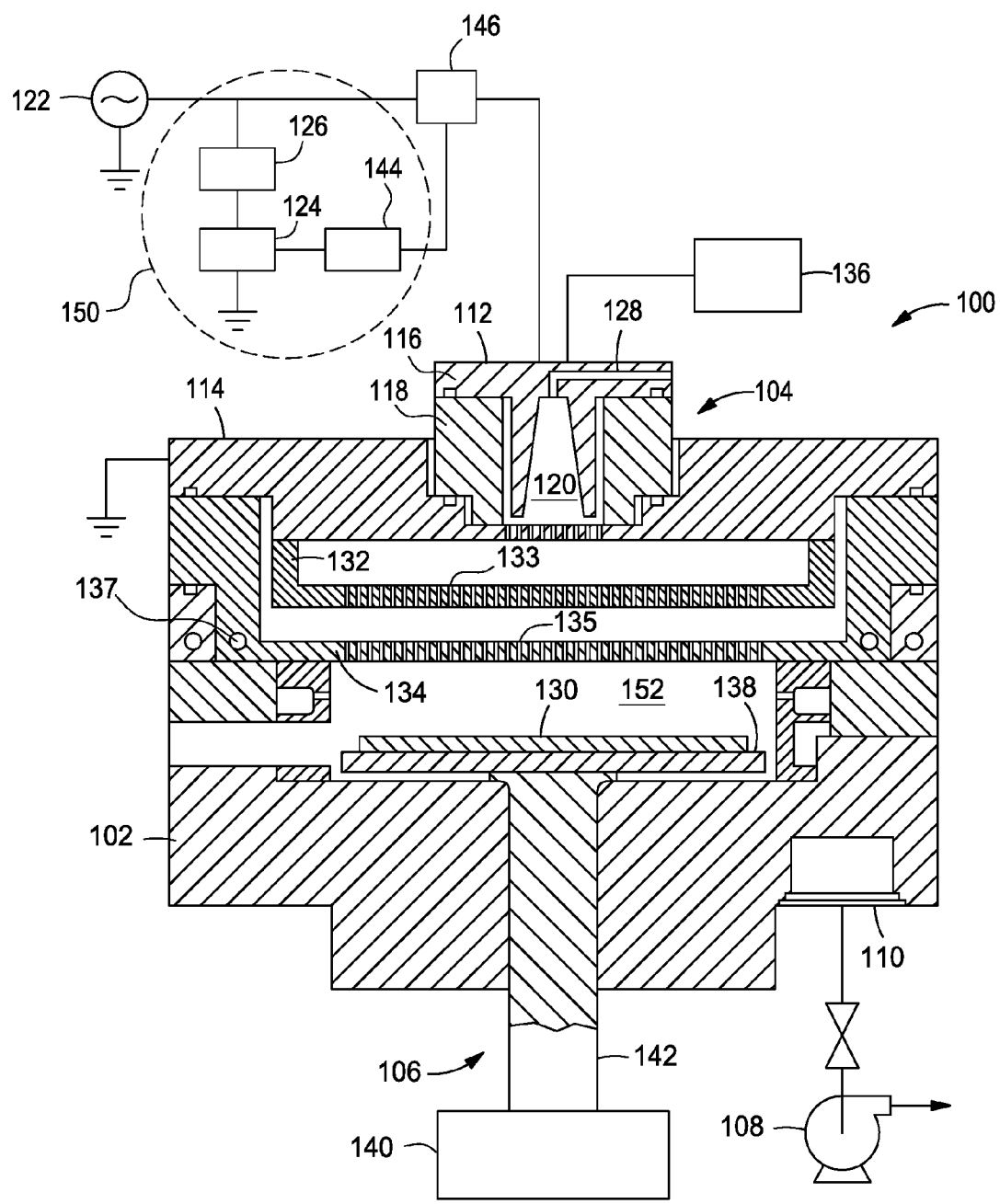
FIG. 1 is a schematic cross-sectional view of a processing chamber that may be used to process a semiconductor substrate according to embodiments of the disclosure.

FIG. 1 is a schematic cross-sectional view of a processing chamber 100 that may be used to process a semiconductor substrate 130 according to embodiments of the disclosure. The processing chamber 100 may be particularly useful for performing a thermal or plasma-based process. The processing chamber 100 generally includes a chamber body 102, a lid assembly 104 disposed above the chamber body 102, and a substrate support assembly 106 partially disposed within the chamber body 102. The lid assembly 104 is disposed above and separated from a substrate processing region 152 (having the substrate 130 disposed therein) by a gas distribution plate 134 and an optional blocker plate 132. Each of the blocker plate 132 (if used) and the gas distribution plate 134 has respective through holes 133, 135 to allow passage of the plasma from the lid assembly 104 to the substrate processing region 152. A vacuum system can be used to remove gases from processing chamber 100. The vacuum system includes a vacuum pump 108 coupled to a vacuum port 110 disposed in the chamber body 102. The processing chamber 100 may additionally include a controller 136 for controlling processes within the processing chamber 100.

The lid assembly 104 includes a first electrode 112 disposed relatively above a second electrode 114. The first electrode 112 and the second electrode 114 form a pair of parallel electrodes. The first and second electrodes 112, 114 may be made of highly doped silicon or metal, such as aluminum, stainless steel, etc. The first and second electrodes 112, 114 may be coated with a protective layer comprising alumina or yttrium oxide. In one embodiment, the first electrode 112 may include two stacked components 116, 118, in which a portion of the component 116 may form a conical cone shape surrounded by the component 118. The stacked components 116, 118 and the second electrode 114 supporting the stacked components 116, 118 define a plasma volume or cavity 120 therebetween. If desired, the stacked components 116, 118 may be constructed as a single, integral unit. In either case, the first electrode 112 may be separated from the second electrode 114 with an insulation member therebetween.

In one embodiment, the first electrode 112 is connected to a radio frequency (RF) power supply 122 and to a DC bias modulation configuration 150, respectively. The RF power supply 122 may operate at between about 0 and about 3000 W, for example about 5 W to about 5000 W, at a frequency between about 400 kHz and about 60 MHz. In one example, the RF power supply 122 operates at a frequency of 13.56 MHz. The DC bias modulation configuration 150 may include a DC power supply 124, a RF filter 126 coupled to the DC power supply 124, and a power controller 144. The RF filter 126 is configured to prevent RF signal, e.g., signals from the RF power supply 122, from entering and damaging the DC power supply 124. The power controller 144 is coupled to the DC power supply 124 and configured to set a set point for the DC power supply 124 based on the DC bias feedback signal transmitted from the first electrode 112. The RF power, delivered by the RF power supply 122 and tuned by a matching network 146, induces a DC bias on the first electrode 112 to control the energy of ion bombardment of the first electrode 112. While not shown, the RF power supply 122 may be disposed in the same enclosure as the DC power supply 124.

The second electrode 114 is connected to ground, thereby forming a capacitance between the first electrode 112 and the second electrode 114. If desired, the second electrode 114 may electrically float. The lid assembly 104 may also include one or more gas inlets 128 for providing a process gas sequentially via through holes 131 formed in the second electrode 114, through holes 133 formed in a blocker plate 132, and then through holes 135 formed in a gas distribution plate 134 to a surface of the substrate 130. The process gas may be an etchant or ionized active radical, such as ionized fluorine, chlorine, or ammonia, or an oxidizing agent, such as ozone. In some embodiments, the process gas may include a plasma containing $NF_3$ and He. If desired, a remote plasma containing the above chemicals may be introduced into the processing chamber 100 via a separate gas inlet (not shown) and to the gas distribution plate 134.

The substrate support assembly 106 may include a substrate support 138 to support the substrate 130 thereon during processing. The substrate support 138 may be coupled to an actuator 140 by a shaft 142 which extends through a centrally-located opening formed in a bottom surface of the chamber body 102. The actuator 140 may be flexibly sealed to the chamber body 102 by bellows (not shown) that prevent vacuum leakage from around the shaft 142. The actuator 140 allows the substrate support 138 to be moved vertically within the chamber body 102 between a process position and a lower, transfer position. The transfer position is slightly below the opening of a slit valve formed in a sidewall of the chamber body 102.

The substrate support 138 has a flat, or a substantially flat, surface for supporting the substrate 130 to be processed thereon. The substrate support 138 may be moved vertically within the chamber body 102 by actuator 140 coupled thereto by shaft 142. In operation, the substrate support 138 may be elevated to a position in close proximity to the lid assembly 104 to control the temperature of the substrate 130 being processed. As such, the substrate 130 may be heated via radiation emitted or convection from the distribution plate 134.

Particle Generation Suppressor by DC Bias Modulation

In an effort to reduce particle contamination of the substrate surface as addressed in the background of this disclosure, the inventors performed a series of exemplary nitride etch processes using the same process recipe with various DC bias schemes (1)-(5) to determine how different DC bias power affects the number of particles on a substrate surface. The exemplary nitride etch process was a selective removal process performed in a process chamber, such as the processing chamber 100 of FIG. 1. Various DC bias schemes (1)-(5) (and schemes (6)-(9) to be discussed below with respect to FIG. 3) were performed using the DC bias modulation configuration 150 of FIG. 1 or the DC bias modulation configuration 500 shown in FIG. 5.

Figure 2:
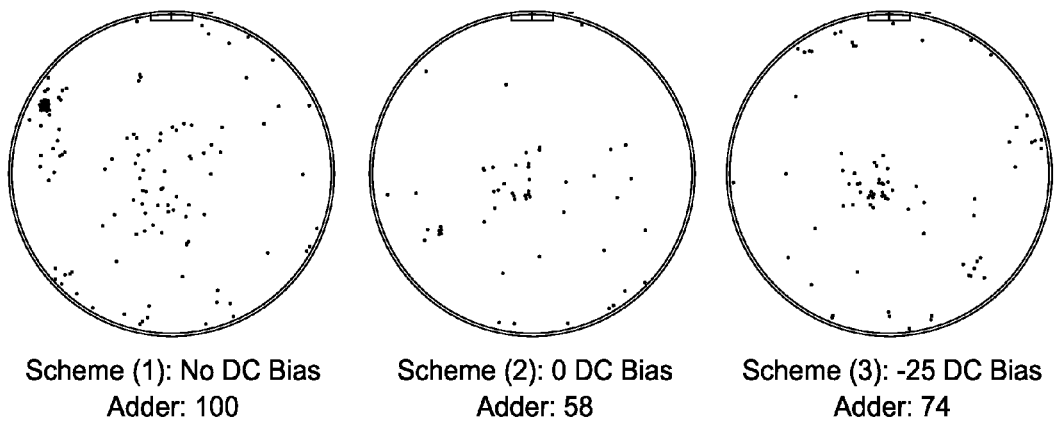
FIG. 2 shows particle measurement for DC bias schemes (1)-(5) according to embodiments of the disclosure.
Figure 2:
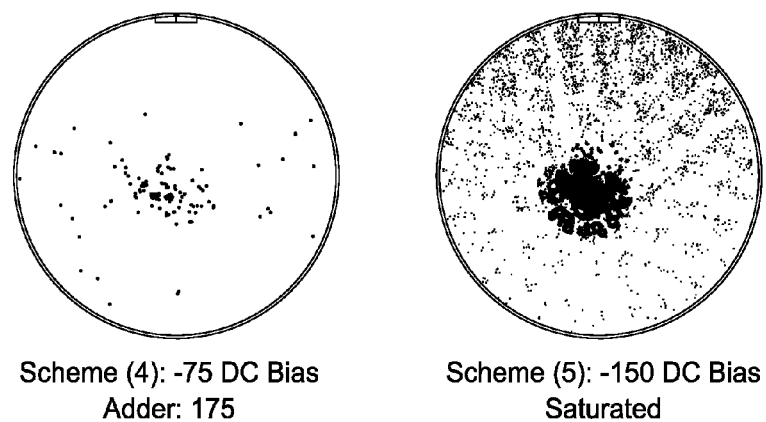

In various DC bias schemes (1)-(5), the exemplary nitride removal process was performed for about 300 seconds at a chamber pressure of about 0.7 Torr, a RF power (13.56 MHz) of about 575 W, an $NF_3$ flow rate of about 20 sccm, an $N_2O$ flow rate of about 900 sccm, a He flow rate of about 4000 sccm, a temperature of the first electrode 112 of about 15° C., a temperature of the second electrode 114 of about 70° C., and each of the first and second electrodes 112, 114 was coated with an oxide protective layer (e.g., yttrium oxide) of about 60 nm in thickness. The particle measurement for each DC bias schemes (1)-(5) is shown in FIG. 2.

The inventors observed that when the second electrode 114 is electrically grounded and no DC bias voltage is applied to the first electrode 112 (i.e., DC power supply 124 is not used at all in the processing chamber 100 of FIG. 1), the DC bias scheme (1) illustrates an increase in the number of particles on the substrate surface from about 45 to about 145 after the removal process. The increased number of the particles is believed to be the result of positive ions generated in the plasma being attracted to the first electrode 112, which is at a negative potential due to an unavoidable, self-induced DC bias (about +31 V) developed on the first electrode 112 when the plasma is created. The ions are accelerated toward the first electrode 112 and bombard the protective coating layer on the first electrode 112 during the removal process, causing a portion of the protective coating layer to fall off and contaminate the substrate surface.

The DC bias schemes (3)-(5) illustrate that the total number of particles on a substrate surface is gradually increased when a negative DC bias voltage of −25 V, −75 V or −150 V is respectively applied to the first electrode 112 (with the second electrode 114 being electrically grounded). Specifically, the DC bias scheme (3) shows an increase in the number of particles on a substrate surface from about 22 to about 96 after the removal process. The DC bias scheme (4) shows an increase in the number of particles on a substrate surface from about 14 to about 189 after the removal process. The DC bias scheme (5) shows an increase in the number of particles on a substrate surface from about 11 to a saturated level after the removal process. DC bias schemes (3)-(5) illustrate a clear trend that an increase in the negative bias voltage to the first electrode 112 would result in more particle generation on the substrate surface, mainly due to the gradual increase of the electrical potential difference between the first electrode 112 and the plasma. When the electrical potential difference between the first electrode 112 and the plasma is increased, a sheath voltage at the first electrode 112 is increased accordingly, which results in the acceleration of the positive ions in the sheath region of the first electrode 112 and an increase in the collision force of the ions with the protective coating layer on the first electrode 112. As a result, more particle generation on the substrate surface is observed. The particle generation becomes more problematic when a high input power (over 550 W) is used for the removal process because higher input power also develops a high self-induced negative DC bias at the powered first electrode 112 of the lid assembly. Such a high self-induced negative DC bias and the sheath voltage at the first electrode 112 (due to electrical potential difference between the first electrode 112 and the plasma) cause high-energy ion bombardment of the protective coating layer on the first electrode 112. Therefore, a portion of the protective coating layer falls off the first electrode 112 and contaminates the substrate surface.

Surprisingly, the inventors have observed that when applying zero DC bias voltage to the first electrode 112 (i.e., the first electrode 112 is operated with a constant zero DC bias voltage while the second electrode 114 is electrically grounded during the removal process), the DC bias scheme (2) only causes a relatively small increase in the number of particles on a substrate surface from about 8 to about 66 after the removal process. The DC bias scheme (2) shows improved particle reduction from 100 to about 58 as compared to the DC bias scheme (1). In fact, the increment of the number of particles under DC bias scheme (2) was found to be the smallest among schemes (1) to (5). Accordingly, the inventors discovered that by applying a constant zero DC bias voltage to the first electrode 112 during the removal process, the particle generation on the substrate surface can be greatly suppressed since the electrical potential difference between the first electrode 112 (RF hot surface) and the plasma ($V_{1st\ electrode} - V_{plasma}$) is reduced, which in turn decreases the sheath voltage at the first electrode 112 (see FIG. 4). As a result, the acceleration of the ions in the sheath region of the first electrode 112 is reduced and the collision force of the ions with the protective coating layer of the first electrode 112 is minimized.

Figure 3:
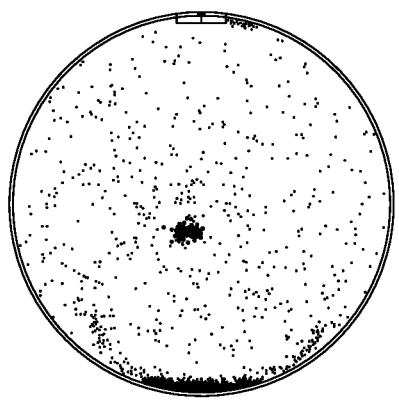
FIG. 3 shows particle measurement for DC bias schemes (6)-(9) according to embodiments of the disclosure.
Figure 3:
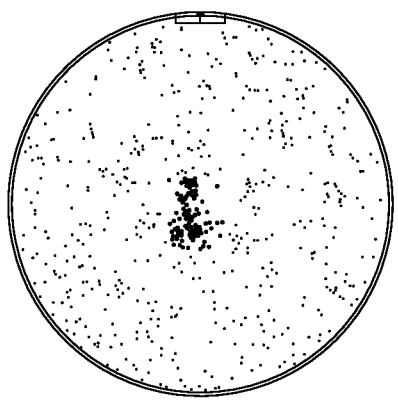
Figure 3:
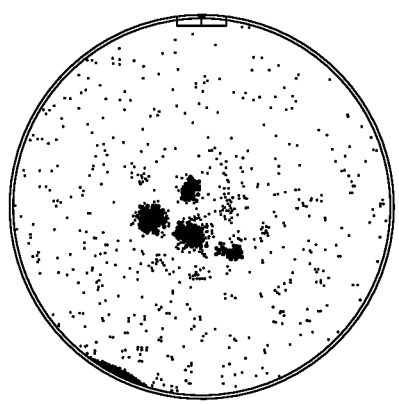
Figure 3:
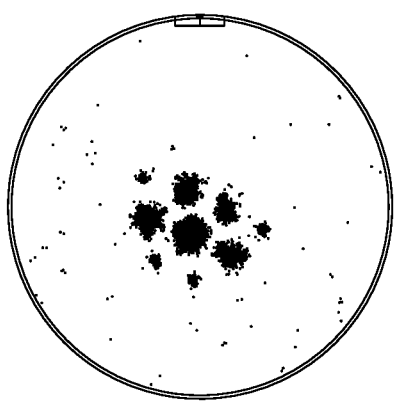

The inventors further performed a series of nitride removal processes using the same process recipe as discussed above with various DC bias schemes (6)-(9) to determine how different DC bias power (particularly positive voltage) affects the number of particles on a substrate surface. The particle measurement for each DC bias schemes (6)-(9) is shown in FIG. 3. The inventors observed that when no DC bias voltage is applied to the first electrode 112 (i.e., DC power supply 124 is not used at all in the processing chamber 100 of FIG. 1), the DC bias scheme (6) illustrates an increase in the number of particles on a substrate surface from about 16 to about 4097 after the removal process. The increased number of the particles is due to previous damage by the negative DC bias, the electrical potential difference between the plasma and the high self-induced negative DC bias developed on the first electrode 112 (causes ion bombardment of the first electrode 112), and also the fact that the potential of the plasma is significantly greater than that of the grounded second electrode 114, which causes ions to bombard the protective coating layer on the second electrode 114 even no DC bias voltage is applied to the first electrode 112 during the removal process.

The DC bias schemes (8) and (9) show that the total number of particles on a substrate surface is significantly increased when a positive DC bias voltage of 75 V and 100 V is respectively applied to the first electrode 112 (with the second electrode 114 being electrically grounded). Specifically, the DC bias scheme (8) shows a significant increase in the number of particles on a substrate surface from about 27 to about 9102 after the removal process. The DC bias scheme (9) also shows a significant increase in the number of particles on a substrate surface from about 11 to about 3469 after the removal process. The DC bias schemes (8)-(9) illustrate that an increase in the positive DC bias voltage to the first electrode 112 would result in more particle generation on the substrate surface, mainly due to a greater increase of the electrical potential difference between the grounded second electrode 114 and the plasma (compared with the first electrode 112, see FIG. 4) since the plasma must assume a positive potential to produce a potential of equivalent magnitude at the grounded second electrode 114 to reflect the larger ion sheath potential caused by the positive DC bias voltage being applied to the first electrode 112. When the electrical potential difference between the second electrode 114 and the plasma is increased, a sheath voltage at the second electrode 114 is also increased, which results in the acceleration of the ions in the sheath region of the second electrode 114 and an increase in the collision force of the ions with the protective coating layer on the second electrode 114. As a result, more particle generation on the substrate surface is observed.

Figure 4:
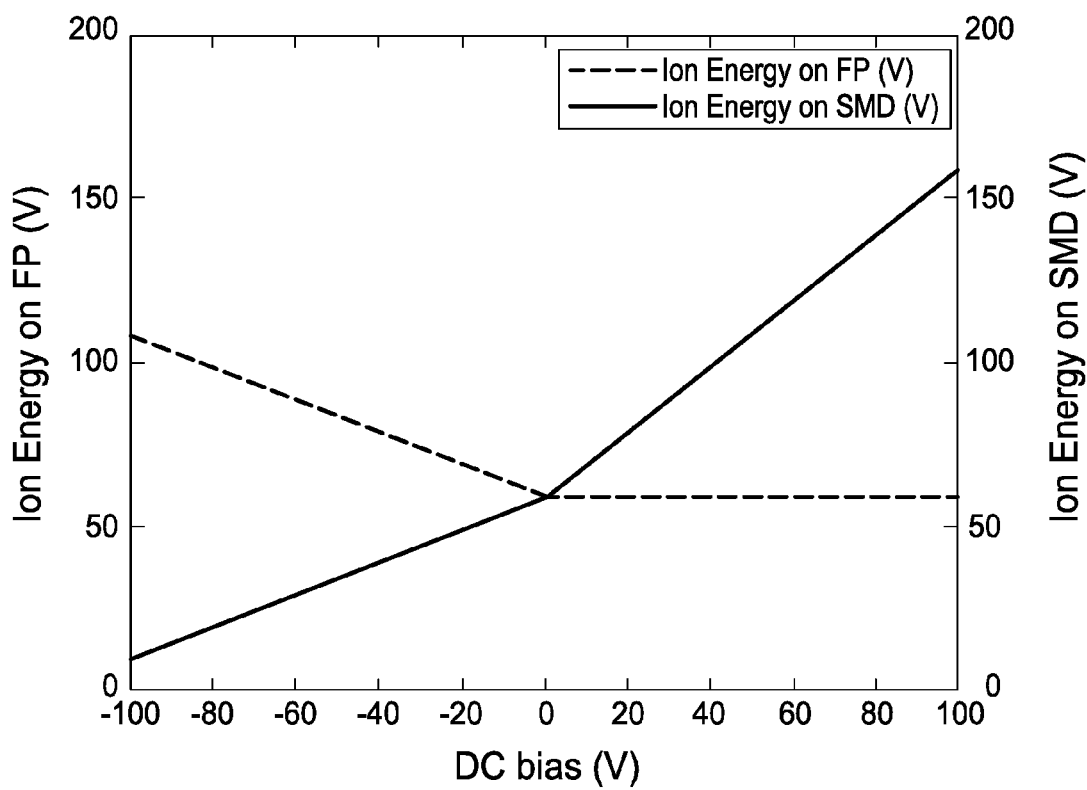
FIG. 4 is a diagram showing the ion energy variation measured on the first electrode (FP) and the second electrode (SMD) at different DC bias voltages according to one embodiment of the disclosure.

Similarly, the inventors observed that when applying zero DC bias voltage to the first electrode 112 (i.e., the first electrode 112 is operated with a constant zero DC bias voltage during the removal process), the DC bias scheme (7) illustrates a relatively small increase in the number of particles on the substrate surface from about 15 to about 767 after the removal process. The DC bias scheme (7) shows that, even the electrodes are damaged from previous negative DC bias, applying zero DC bias voltage still improves particle reduction from 4081 to about 752 when compared to the DC bias scheme (6). In fact, the increment of the number of particles under DC bias scheme (7) was found to be the smallest among schemes (6) to (9). Accordingly, the inventors discovered that by applying a constant zero DC bias voltage to the first electrode 112 during the removal process, the particle generation on the substrate surface can be greatly suppressed since the electrical potential difference between the first electrode 112 and the plasma ($V_{1st\ electrode} - V_{plasma}$) and the electrical potential difference between the plasma and the second electrode 114 (grounded surface) and chamber wall (grounded surface) ($V_{2nd\ electrode} - V_{plasma}$) is are substantially identical to each other, which results in a minimum sheath voltage of about 60 V at the first and second electrodes 112, 114 (see FIG. 4). Accordingly, both the first and second electrodes 112, 114 experience substantially the same ion bombardment from the plasma due to the high RF input power. However, the ion energy of the bombardment on both electrodes 112, 114 when zero DC bias voltage is applied to the first electrode 112 is relatively less than the ion energy of the bombardment on both electrodes 112, 114 when positive or negative DC bias voltage is applied to the first electrode 112, as evidenced in FIG. 4, which is a diagram 400 showing the ion energy variation measured on the first electrode (FP) and the second electrode (SMD) at different DC bias voltages according to one embodiment of the disclosure. FIG. 4 shows that the ion energy measured on the first and second electrodes is about 60 V when zero DC bias voltage is applied to the first electrode, which is relatively less than the ion energy measured on the first electrode (about 110 V) or second electrode (about 160 V) when 100 V and −100 V of DC bias voltage is respectively applied to the first electrode.

Based on the DC bias schemes (1)-(9) above, the inventors have determined that the protective coating layer on the electrodes 112, 114 can be easily damaged by ion bombardment in which the ion energy is greatly governed by the self-induced DC bias at the first electrode 112. The inventors discovered that applying high DC bias voltage (regardless of the positive or negative DC bias voltage) to the first electrode 112 will result in higher particle contamination on the substrate surface. However, applying a constant zero DC bias voltage to the first electrode 112 during a high power film removal process can help minimize the electrical potential difference between the first electrode 112 (RF hot) and the plasma ($V_{1st\ electrode} - V_{plasma}$), or the electrical potential difference between the plasma and the second electrode 114 (grounded surface) and chamber wall (grounded surface) ($V_{2nd\ electrode} - V_{plasma}$), without any significant impact on the film etch profile. Minimizing the electrical potential difference between the plasma and the electrodes 112, 114 can reduce particle generation because the sheath voltage at both sides of the first and second electrodes is kept to minimum even when RF input power is high (over 550 W). Therefore, the collision force of the ions with the protective coating layer on the first and second electrodes 112, 114 is decreased, resulting in the reduction of particle generation on the substrate surface.

If desired, the DC bias voltage can be modulated to control the amount of ion bombardment on the first electrode 112 and/or the second electrode 114 by controlling the DC bias voltage polarity. To control the DC bias accurately, a close-loop DC bias modulation may be performed using a power controller (e.g., the power controller 144 shown in FIG. 1) based upon, among other factors such as chamber configuration, surface area of the electrodes, chemistry and process conditions, DC bias feedback signal transmitted from the first electrode 112, or based upon the coating quality of the electrodes. For example, if the first electrode 112 has a weaker protective coating layer (due to its conical cone shape which disables strong coating by nature) and the second electrode 114 has a stronger protective coating layer, a slightly positive DC bias may be delivered to the first electrode 112 to decrease the bombardment on the first electrode 112. In one exemplary embodiment, the power controller 144 may be configured to monitor a self-induced DC bias on the first electrode 112 (RF hot) without applying DC bias voltage to the first electrode 112. Depending upon the DC bias feedback, an appropriate DC bias voltage is applied to the first electrode 112 during the removal process. The DC bias voltage may be zero or may be adjusted to control the amount of ion bombardment on the first electrode 112 and/or the second electrode 114 by controlling the DC bias voltage polarity as discussed above.

Various approaches may be implemented to further enhance the reduction of particle generation on the substrate surface. For example, in some embodiments a bonding/adhesion material may be used between the protective coating layer and the underlying electrodes to provide a stronger protective coating layer. The bonding/adhesion material is particularly advantageous for the first electrode 112 because the first electrode 112 may have a weaker coating quality due to its conical cone shape which disable strong coating by nature, whereas the second electrode 114 may have much better coating quality since it has through holes 131 at the bottom that would enable stronger coating capability to withstand the ion bombardment. In some embodiments, the gas distribution plate 134 may be subjected to an effective cooling treatment (to an extent not affecting the process performance) so as to lower the temperature of the second electrode 114 during the removal process. This is because the second electrode 114 heats up and cools down during the process and the protective coating layer disposed thereon may experience thermal stresses from such a temperature cycling, resulting in increased particle generation. Lowering the temperature of the second electrode 114 (e.g., by flowing a cooling fluid through a channel 137 formed in the gas distribution plate 134) reduces temperature variations of the second electrode 114, thereby facilitating the reduction of particle generation on the substrate surface.

Figure 5:
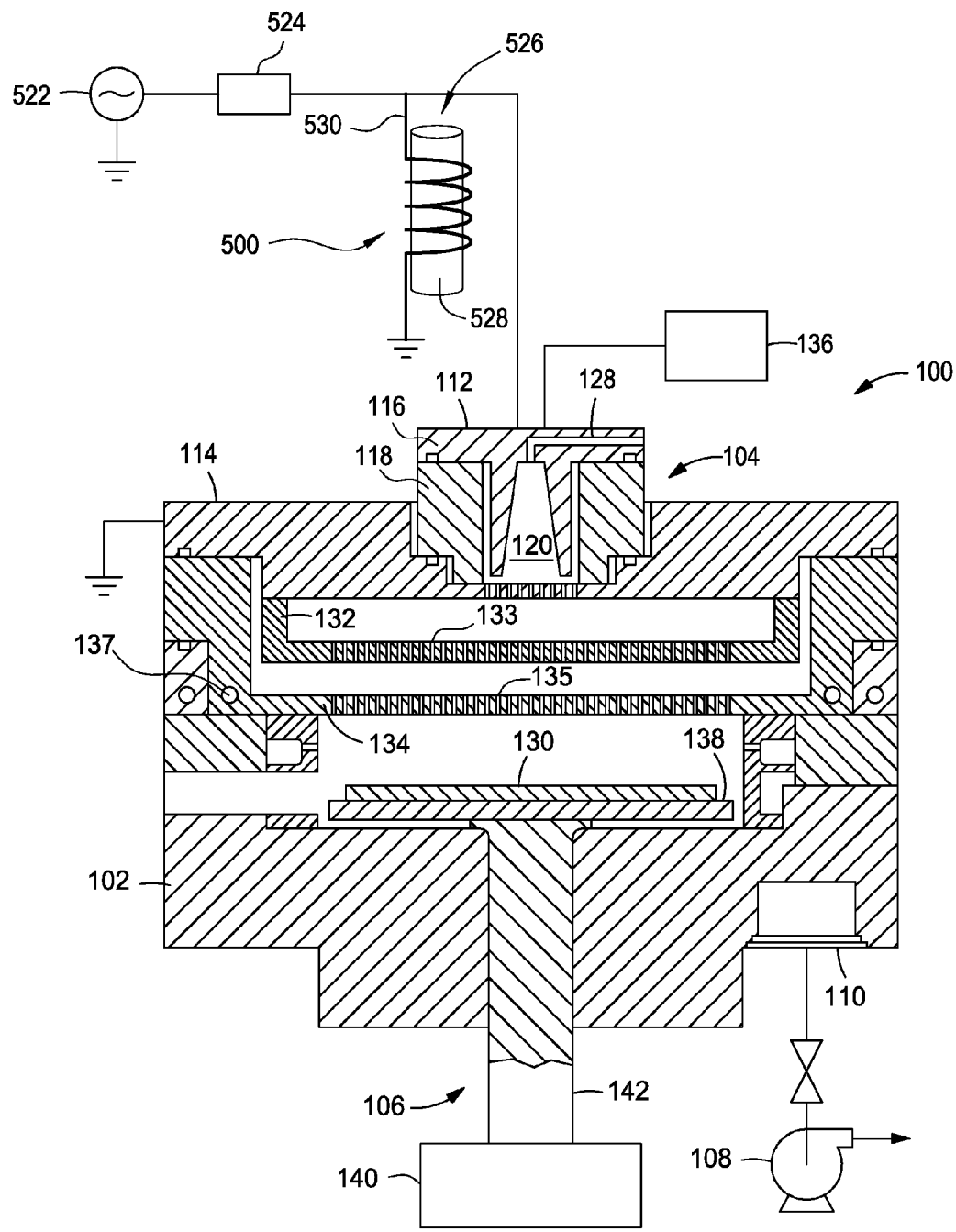
FIG. 5 depicts a schematic cross-sectional view of the processing chamber of FIG. 1 showing the lid assembly coupled to a DC bias modulation configuration according to embodiments of the disclosure.

The concept of applying a constant zero DC bias voltage to a powered electrode of a lid assembly 104 (which confines the glow discharge region of a plasma) to reduce the particle contamination may be realized in various approaches, such as one shown in FIG. 5. FIG. 5 depicts a schematic cross-sectional view of the processing chamber 100 of FIG. 1 showing the lid assembly 104 coupled to a DC bias modulation configuration 500 according to embodiments of the disclosure.

In one embodiment, the first electrode 112 is electrically connected to a radio frequency (RF) power supply 522 and a DC bias modulation configuration 500, respectively. The DC bias modulation configuration 500 may be disposed at any position outside the lid assembly 104, such as a location between the first electrode 112 and the ground. While not shown, the RF power supply 522 may be disposed in the same enclosure as the DC bias modulation configuration 500. The DC bias modulation configuration 500 generally acts as a low pass filter configured to direct a self-induced DC bias and/or any DC bias generated at the first electrode 112 to ground while preventing RF power, delivered by the RF power supply 522 and tuned by a matching network 524, from entering to the ground but instead going to the first electrode 112. Since the DC bias of the first electrode 112 is directed to the ground, the first electrode 112 can be maintained at ground potential (i.e., DC bias voltage at the first electrode 112 is constantly kept at zero) during the removal process regardless of RF input power or process. As a result, the electrical potential difference between the first electrode 112 (RF hot) and the plasma ($V_{1st\ electrode} - V_{plasma}$), or the electrical potential difference between the plasma and the second electrode 114 (grounded surface) and chamber wall (grounded surface) ($V_{2nd\ electrode} - V_{plasma}$) is reduced or minimized. As discussed above with respect to FIGS. 2-4, minimizing the electrical potential difference between the plasma and the electrodes 112, 114 can reduce particle generation without any significant impact on the film etch profile because the sheath voltage at both sides of the first and second electrodes is kept at minimum. Therefore, the collision force of the ions with the protective coating layer formed on the first and second electrodes 112, 114 is decreased, resulting in the reduction of particle generation on the substrate surface.

In one embodiment shown in FIG. 5, the DC bias modulation configuration 500 generally includes a core element 528 and a coil 530 wound around a portion of the core element 528. The coil 530 may be evenly distributed over the length of the core element 528 to acquire an increase in inductance effect of the DC bias. Since the core element 528 is used to enhance the inductance effect, the coil 530 itself may be used to direct the DC bias voltage without the core element 528 being present in the DC bias modulation configuration 500 in some embodiments. The core element 528 may comprise a high magnetic permeability rod or tube, for example, a ferrite rod, but could be other magnetic material useful at lower frequency depending on the coupling structure. In one embodiment, the core element 528 may have a length of about 3 inch to about 8 inches, for example about 5 inches, and a diameter of about 0.2 inch to about 2 inches, for example about 1 inch.

The resulting DC bias modulation configuration 500 may have a power attenuation of about 50 db at 13.56 MHz frequency and an inductance of about 22 uH (equivalent to a resistance of about 1900 Ohms), which provides a high impedance to RF signal and therefore the RF signal is prohibited from entering to the ground through the DC bias modulation configuration 500. However, the resistance at such a high value is considered to be electrically closed for DC signal. In other words, the DC bias modulation configuration 500 has no impedance to the DC bias voltage.

While the core element 528 and coil 530 are illustrated as an example for the DC bias modulation configuration 500, these components are not intended to be limiting as to scope of disclosure described herein. Instead, any electrical component or circuit that can be configured as a low pass filter or band pass filter (either in a single-stage or multi-stage configuration) to cutoff frequency of interest is contemplated, as long as the electrical component or circuit is capable of providing a high impedance path to the RF signal and a low or no impedance path to the DC signal from the first electrode 112 through to the ground.

In summary, embodiments of reducing particle generation in a processing chamber are realized by applying a constant zero DC bias voltage to a powered electrode (which is in a parallel relationship with a grounded electrode to confine the glow discharge region of a plasma) of a lid assembly disposed above a substrate processing region of a chamber body to minimize the electrical potential difference between the powered electrode and the plasma or the electrical potential difference between the grounded electrode and the plasma. Minimizing the electrical potential difference between the plasma and the electrodes can reduce particle generation because the acceleration of the ions in the sheath region of the electrodes is reduced and the collision force of the ions with the protective coating layer on the electrodes is minimized. As a result, particle generation on the substrate surface is reduced.

While the foregoing is directed to embodiments of the present disclosure, other and further embodiments of the disclosure may be devised without departing from the basic scope thereof, and the scope thereof is determined by the claims that follow.

The invention claimed is:

1. A method for processing a substrate in a processing chamber, comprising:
   generating a plasma between a first electrode and a second electrode of the processing chamber by applying a radio frequency (RF) power to the first electrode during a process, wherein the first electrode is disposed above the second electrode, and the second electrode is disposed above and opposing a substrate support having a substrate supporting surface; and
   applying a constant zero DC bias voltage to the first electrode during the process.

2. The method of claim 1, wherein the RF power is from about 0 W to about 3000 W.

3. The method of claim 1, wherein the first electrode and the second electrode are separate from the substrate support by a gas distribution plate having a plurality of through holes.

4. The method of claim 1, wherein the second electrode is electrically connected to ground.

5. The method of claim 1, wherein the applying a constant zero DC bias voltage to the first electrode is controlled by a power controller coupled to a DC power supply.

6. The method of claim 1, wherein the first electrode and/or the second electrode is coated with a protective layer comprising alumina or yttrium oxide.

7. The method of claim 1, wherein the process is an etch process.

8. A method for processing a substrate in a processing chamber, comprising:
   generating a plasma between a first electrode and a second electrode by applying radio frequency (RF) power to the first electrode, wherein the first electrode is disposed above the second electrode, and the second electrode is disposed above and opposing a substrate support having a substrate supporting surface;
   monitoring a DC bias voltage generated at the first electrode to obtain a DC bias feedback signal; and
   controlling a DC bias voltage polarity at the first electrode based on the DC bias feedback signal by operating the first electrode with a constant zero DC bias voltage during an etch process.

9. The method of claim 8, wherein the operating the first electrode with a constant zero DC bias voltage is performed by applying a zero DC bias voltage to the first electrode.

10. The method of claim 8, wherein the operating the first electrode with a constant zero DC bias voltage is performed by directing a DC bias voltage from the first electrode to ground.

11. The method of claim 8, wherein the first electrode and the bottom electrode are separate from the substrate support by a gas distribution plate having a plurality of through holes.

12. The method of claim 8, wherein the RF power is from about 0 W to about 3000 W.

\* \* \* \* \*